United States Patent
Coushaine et al.

(10) Patent No.: US 7,261,451 B2
(45) Date of Patent: Aug. 28, 2007

(54) COLORED HEADLAMP

(75) Inventors: Charles M. Coushaine, Rindge, NH (US); Thomas Tessnow, Weare, NH (US); Michael Tucker, Henniker, NH (US)

(73) Assignee: Osram Sylvania Inc., Danvers, MA (US)

( * ) Notice: Subject to any disclaimer, the term of this patent is extended or adjusted under 35 U.S.C. 154(b) by 7 days.

(21) Appl. No.: 11/332,749

(22) Filed: Jan. 13, 2006

(65) Prior Publication Data

US 2006/0187671 A1 Aug. 24, 2006

Related U.S. Application Data

(63) Continuation-in-part of application No. 11/064,239, filed on Feb. 23, 2005, now Pat. No. 7,008,096.

(51) Int. Cl.
*F21V 29/00* (2006.01)
(52) U.S. Cl. .................. 362/544; 362/228; 362/540; 362/545
(58) Field of Classification Search .......... 362/184, 362/228, 229, 231, 511, 540, 543, 544, 545, 362/555, 800
See application file for complete search history.

(56) References Cited

U.S. PATENT DOCUMENTS

| 4,912,334 | A | 3/1990 | Anderson |
| 4,963,798 | A | 10/1990 | McDermott |
| 5,685,637 | A | 11/1997 | Chapman et al. |
| 6,280,049 | B1 | 8/2001 | Tam |
| 6,690,114 | B2 * | 2/2004 | Nakayama et al. .......... 315/77 |
| 6,756,893 | B1 | 6/2004 | Fernandez |

* cited by examiner

*Primary Examiner*—John Anthony Ward
(74) *Attorney, Agent, or Firm*—William E. Meyer

(57) ABSTRACT

A vehicle headlamp (10) has a first light source (12) for illuminating an area forward of the light source (12). The first light source (12) is preferably a filamented tungsten halogen capsule or an arc discharge source. The first light source (12) is arrayed along a longitudinal axis (14) and emits substantially white light. A second light source (16) in the form of a plurality of light emitting diodes is arrayed about the first light source (12), and the second light source (16) emits light via an optic 42 for providing a daylight running light. Via the optic 42 light is emitted in a forward direction as well as toward the reflector to increase the lighting area.

5 Claims, 5 Drawing Sheets

COLORED HEADLAMP

CROSS-REFERENCE TO RELATED APPLICATION

This application is a continuation-in-part of U.S. non-provisional utility application entitled Colored Headlamp, filed Feb. 23, 2005, Ser. No. 11/064,239, now U.S. Pat. No. 7,008,096 naming Charles M. Coushaine, Thomas Tessnow, Brad Ernest, and Daniel S. Devir as inventors.

TECHNICAL FIELD

This invention relates generally to light sources and more particularly to vehicle headlamps. Still more particularly, it relates to such headlamps employing different light emitters for achieving both functional illumination and particular aesthetic effects.

BACKGROUND ART

It has been proposed to use solid-state light sources, such as light emitting diodes, as illumination units for vehicle lamps. These light sources have an advantage over more conventional light sources because of their small size and long life; however, the amount of light available from any single unit is small, thus requiring many units to provide an adequate source of illumination, with a concomitant increase in cost. Therefore, it would be an advance in the art to utilize the aesthetic effect of light emitting diodes in conjunction with the greater illumination capabilities of more conventional light sources.

DISCLOSURE OF INVENTION

It is, therefore, an object of the invention to obviate the disadvantages of the prior art.

It is another object of the invention to enhance illumination sources.

Yet another object of the invention is a vehicle headlamp employing a first light source for illumination effects and a second light source for aesthetic effects.

These objects are accomplished, in one aspect of the invention, by the provision of a vehicle headlamp comprising: a first light source for illuminating an area forward of the light source, said first light source being arrayed along a longitudinal axis and emitting substantially white light; and a second light source arrayed about said first light source, said second light source emitting light in a direction substantially normal to said longitudinal axis in one or more colors that are selected from individual portions of the electromagnetic spectrum.

Still more particularly, a vehicle headlamp comprises: a reflector; a headlamp assembly operatively located in said reflector and comprising a socket having a first light source positioned therein, said assembly having a longitudinal axis; and a plurality of secondary light sources on said socket and arrayed about said longitudinal axis and emitting light in a direction substantially normal to the longitudinal axis and in one or more colors selected from individual color portions of the electromagnetic spectrum.

Employing the secondary light sources allows aesthetic variation in the lighting, such as by selecting the emitted color from the second light sources to match the vehicle body color. Alternatively, the second light sources can be illuminated sequentially to provide a pleasing effect when viewed from the front of the vehicle. The second light sources can also be used as daylight running lights should that effect be desired. This latter use would afford a better color selection than the choices now available.

Further, since the second light source or sources are provided directly with the first or main illumination source, replacement occurs more easily than with previous embodiments of light emitting diodes, which were typically hard-wired into position.

BEST MODE FOR CARRYING OUT THE INVENTION

Figure 1:
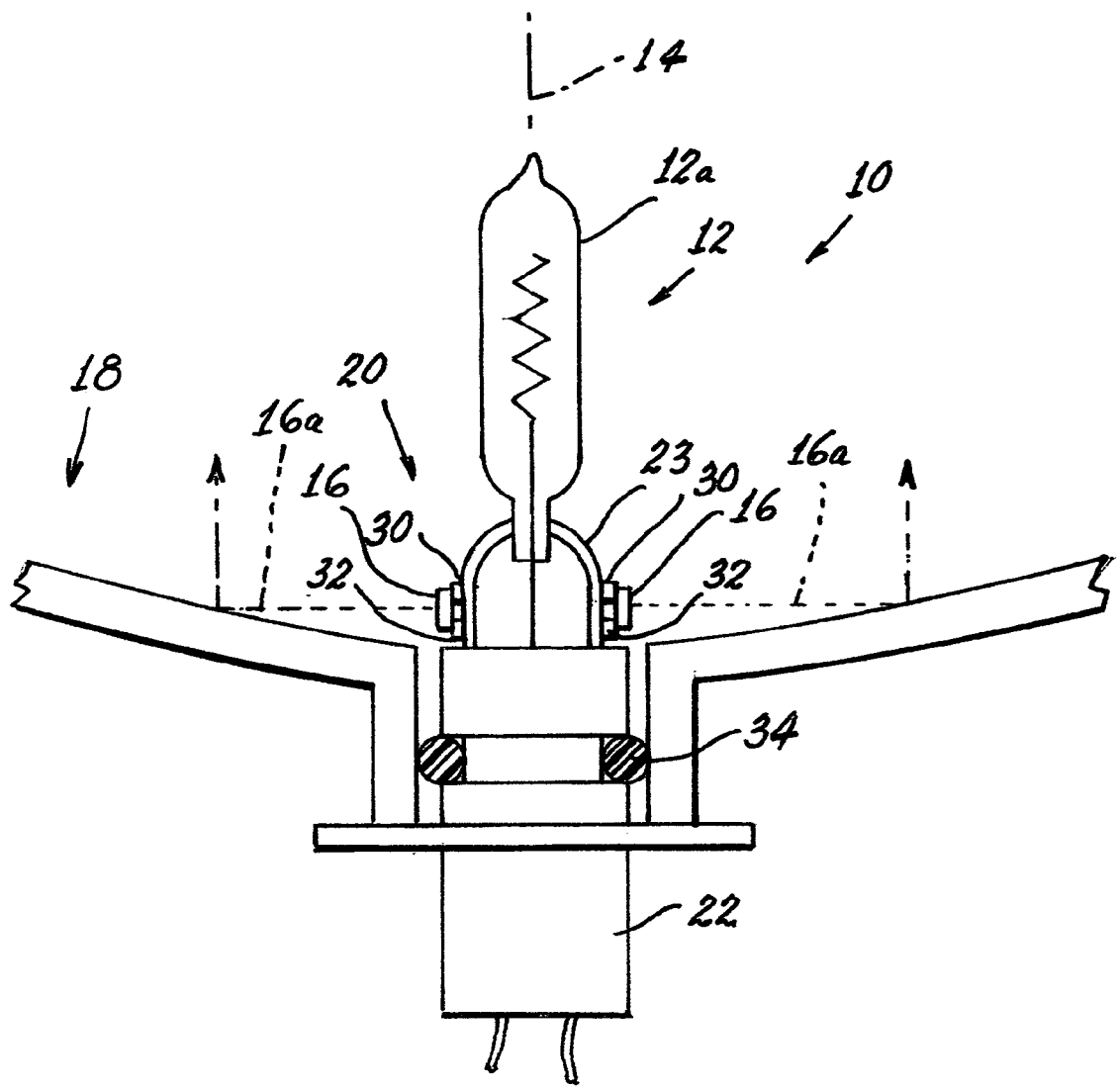
FIG. 1 is an elevational, sectional view of an embodiment of the invention.

For a better understanding of the present invention, together with other and further objects, advantages and capabilities thereof, reference is made to the following disclosure and appended claims taken in conjunction with the above-described drawings.

Referring now to the drawings with greater particularity, there is shown in FIG. 1a vehicle headlamp 10 comprising a first light source 12 having a bulb 12a for illuminating an area forward of the light source 12. The first light source 12 is preferably a filamented tungsten halogen capsule. The bulb 12a is arrayed along a longitudinal axis 14 and emits substantially white light A second light source 16 is arrayed about the bulb 12a, and the second light source 16 emits light in a direction different from the first light source, for example, along an axis 16a.

The first light source 12 and bulb 12a is part of a headlamp assembly 20 that is operatively located in a reflector 18 and additionally includes a socket 22 having a retainer 23 mounted therein. Such headlamp assemblies are known in the art. Secondary light sources 16 are fixed to the socket 22, in this instance by being operatively attached to the retainer 23, and are arrayed about the longitudinal axis 14. The secondary light sources 16 in this instance are light emitting diodes and they can be chosen to emit in a single color or in multiple colors, for example, red, green and blue, or in any blend of these colors. Electrical connection can be supplied to the diodes by mounting the diodes between two electrically conductive strips 30, 32, as shown in FIG. 1. By selecting in advance the colors to be emitted, the reflector can be given a unique glow to provide a desired aesthetic effect, such as matching a vehicle's body color. Also, the diodes could be selected to provide white light emission and energized to provide daytime running lights as a more energy efficient alternative to operating a conventional headlamp at a low power setting or simply to be illuminated when the first light source is not illuminated at all, thus providing a more brilliant, less washed out appearance.

Alternatively, electrical coupling to the second light source can be provided from the same connections s the first light source or they can be provided through alternate second connections.

The headlamp assembly 20 can be positioned in the reflector 18 by any suitable means, such as screw threads, bayonet fittings or flange and groove mounting, all of which have been employed in the past. A gasket 34 can also be used to provide an environmental seal.

Figure 2:
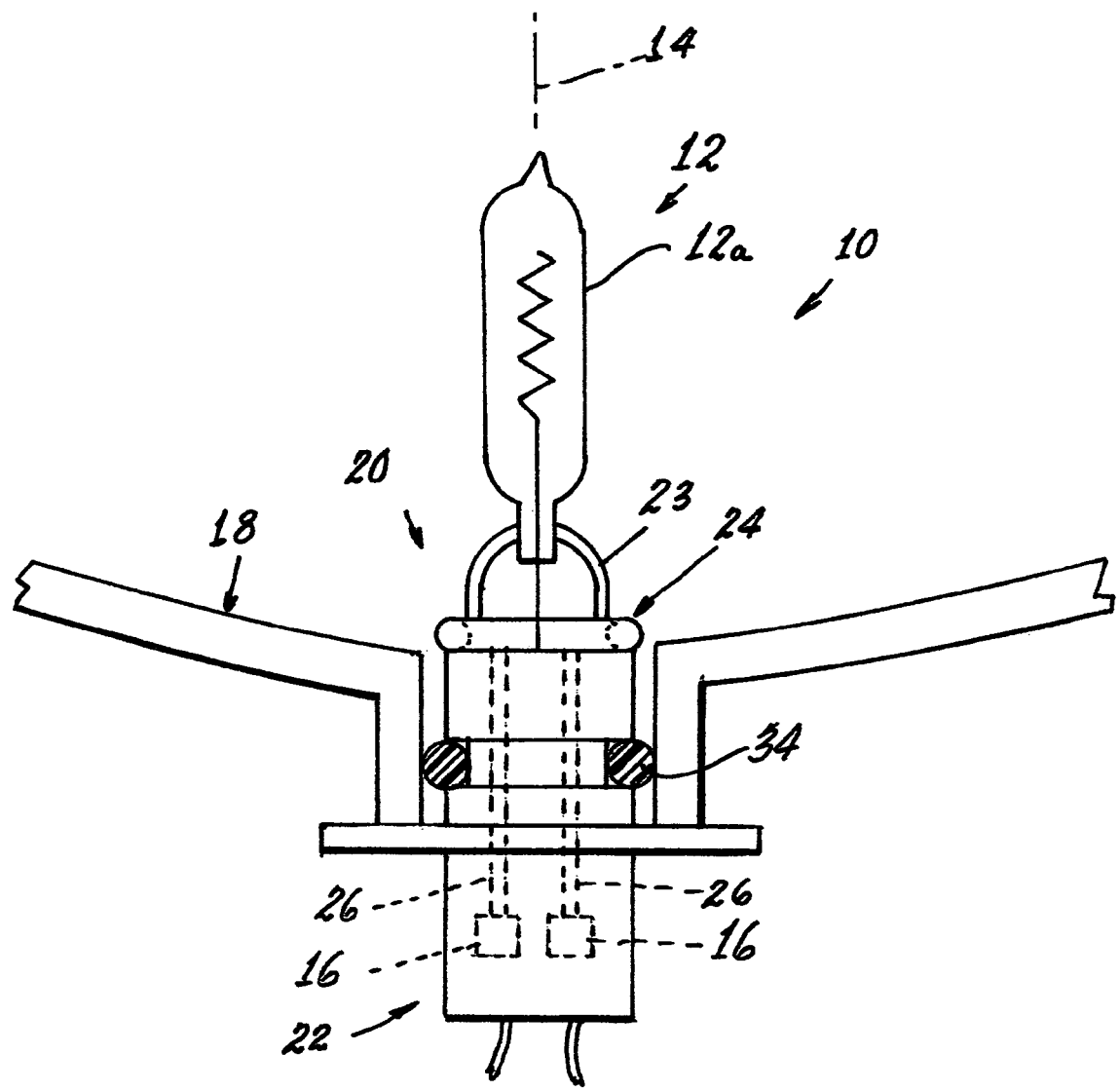
FIG. 2 is a similar view of an alternate embodiment of the invention.

An alternate embodiment is shown in FIG. 2 wherein the aesthetic lighting is provided by embedding one or more of the diodes 16 within the socket 22 and directing the light emitted therefrom through light pipes 26 to a light transmitting light guide, such as an optic ring 24 that surrounds the retainer 23.

Again, the number and colors of the light emitting diodes can be chosen to provide any of multiple effects. If desired, the light emitting diodes can be provided with an independent battery source of power, such as from nickel-cadmium batteries, which can be charged and re-charged when the road-illuminating portion of the headlamp, i.e., first light source 12, is energized Still further embodiments specifically suited for daylight running lights are detailed in FIGS. 3-5, wherein the second light sources 16 are affixed to a peripheral flange 40 extending from socket 22. The second light sources 16 are preferably light emitting diodes and can be selected to provide single colors or mixed colors.

Figure 5:
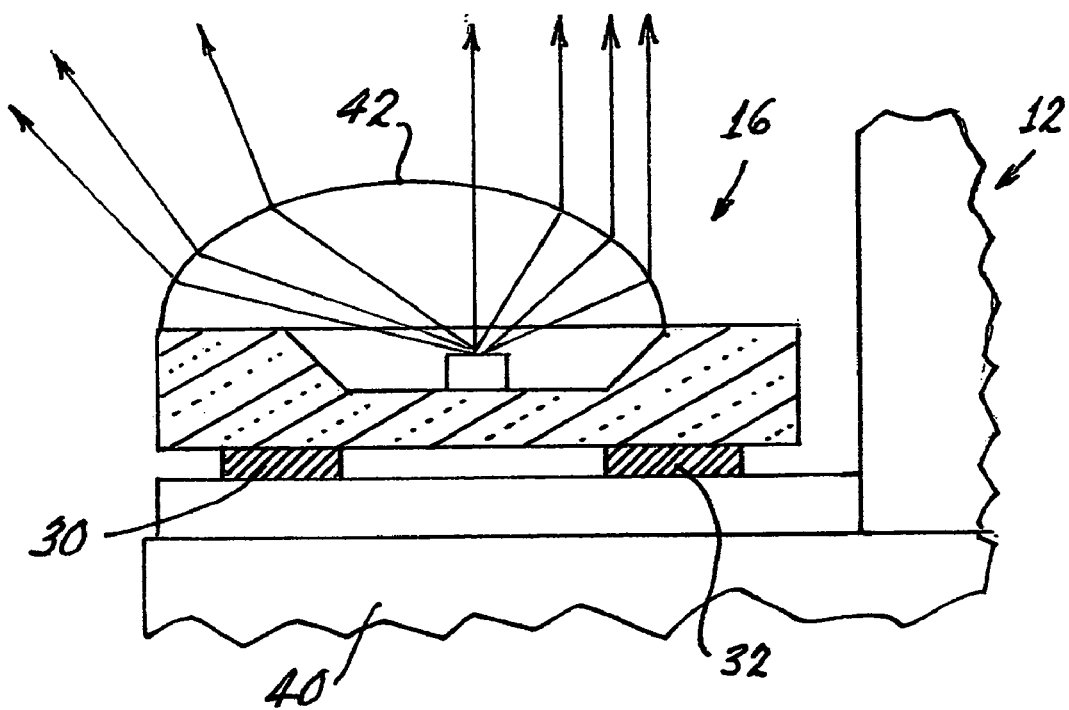
FIG. 5 is an enlarged, diagrammatic view of a light emitting diode element useful for daylight running light applications.

To take full advantage of the characteristics of the light emitting diodes, each of them is fitted with an asymmetrical optic 42 shown most clearly in FIG. 5. The optic 42 directs some of the emitted light in a forward direction and some of the emitted light toward the reflector 18, thus providing a wider area of visibility.

Alternatively, a single, circular optic, such as shown in FIG. 2 as optic 24, can be employed to cover all of the plurality of second light sources 16.

Figure 3:
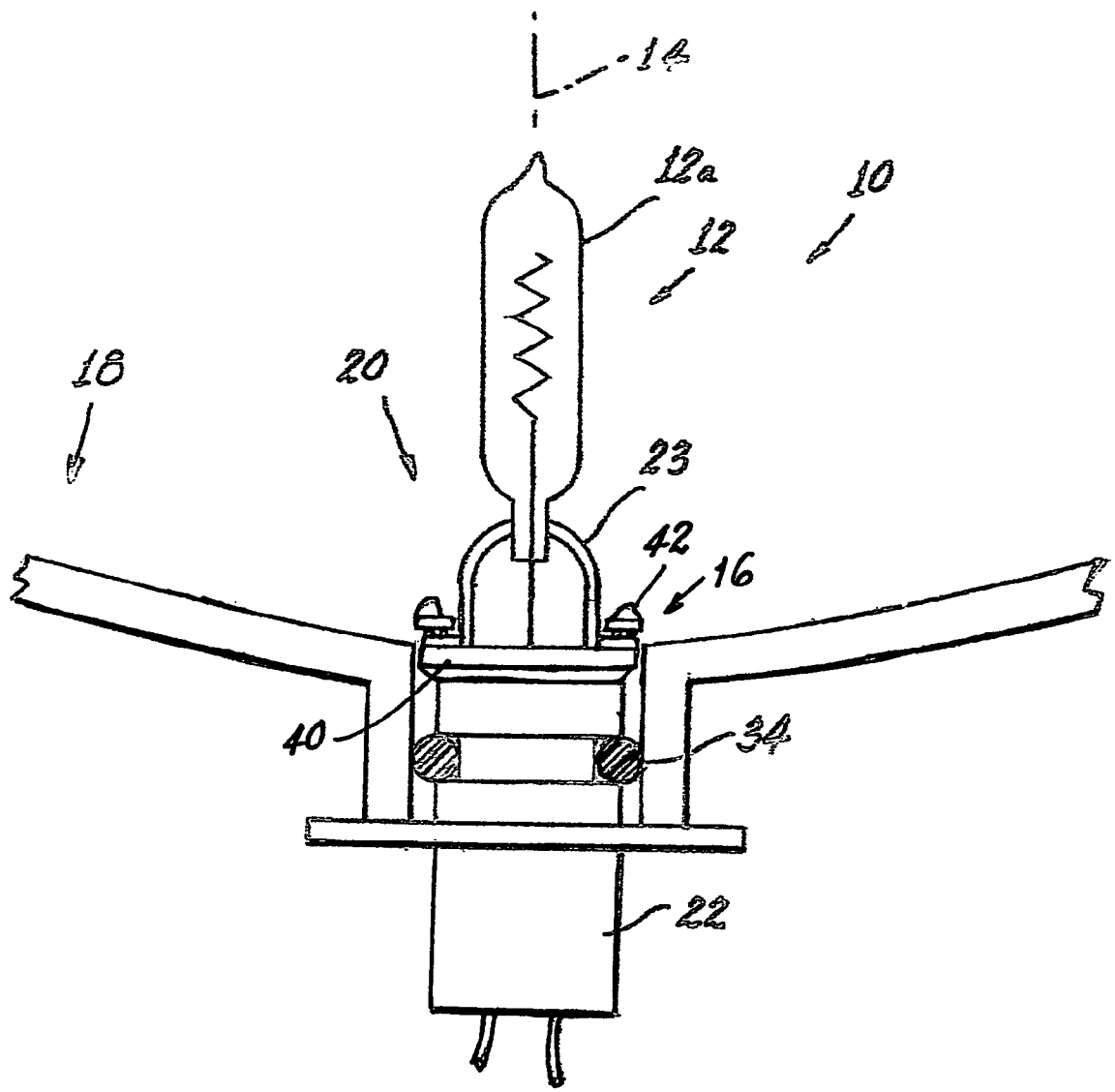
FIG. 3 is a similar view of yet another alternate embodiment of the invention.
Figure 4:
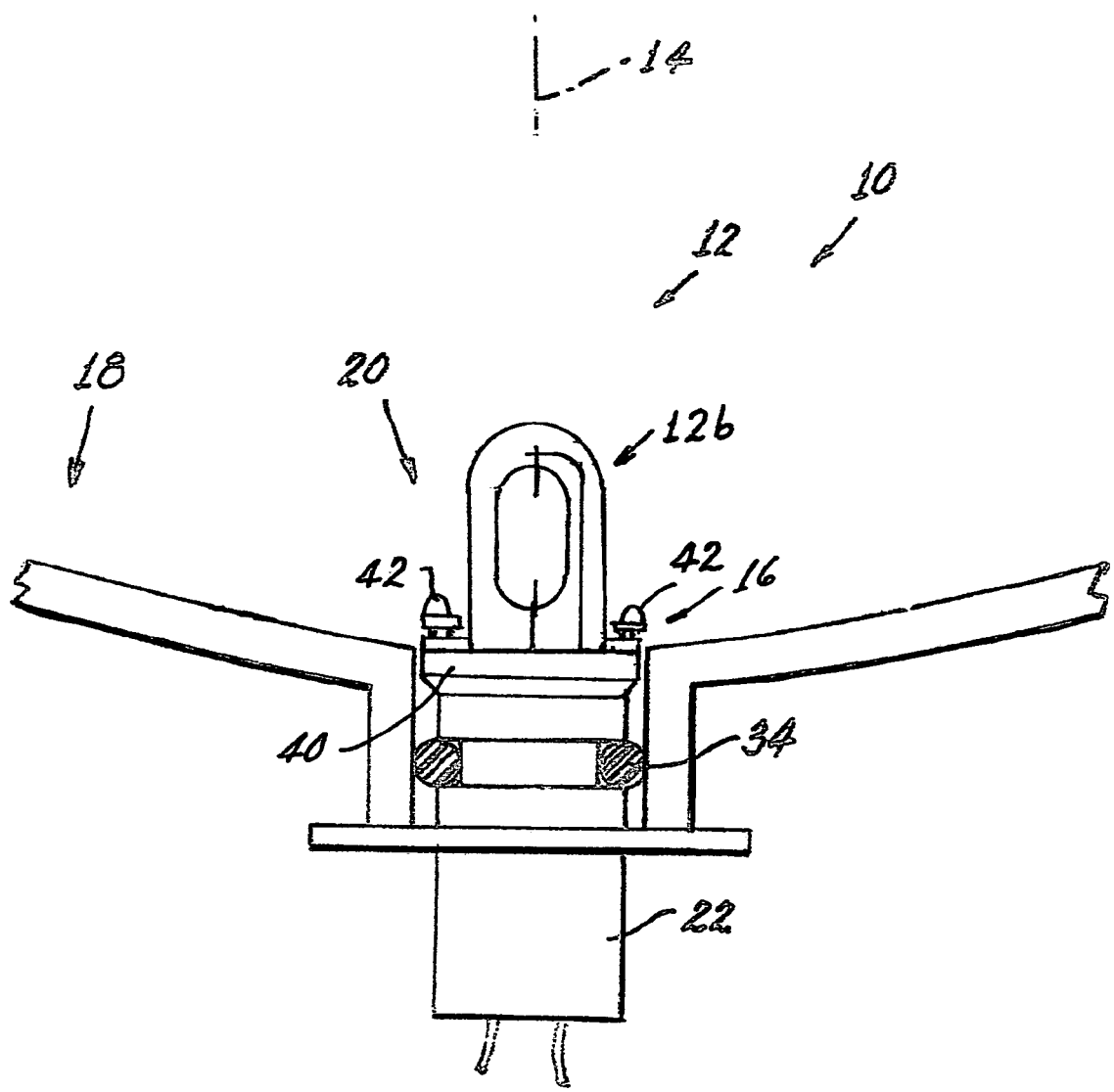
FIG. 4 is a similar view of still another embodiment of the invention.

The first light source 12 can be a tungsten halogen bulb 12a, as shown FIGS. 1, 2 and 3 or, alternatively, an arc discharge bulb 12b, as shown in FIG. 4.

Electrical connection to the second light sources 16 can still be made via conductive strips 30, 32, although in the embodiments of FIGS. 3-5 the strips will be applied to the flange 40 instead of the retainer 23.

Thus there is provided a plural light source having true illumination capabilities together with aesthetic lighting capabilities. The light source is compact, convenient and easily replaceable.

While there have been shown and described what are present considered to be the preferred embodiments of the invention, it will be apparent to those skilled in the art that various changes and modifications can be made herein without departing from the scope of the invention as defined by the appended claims.

What is claimed is:

1. A vehicle headlamp comprising:
   a reflector;
   a headlamp assembly operatively located in said reflector and comprising a socket having a first light source positioned therein, said assembly having a longitudinal axis;
   a flange extending peripherally away from said socket; and
   a plurality of second light sources positioned on said flange and arrayed about said longitudinal axis and emitting light via an optic, said optic comprising an individual asymmetrical lens associated with each of said plurality of second light sources.

2. The vehicle headlamp of claim 1 wherein said secondary light sources are light emitting diodes.

3. The vehicle headlamp of claim 1 wherein said first light source is a filamented tungsten halogen bulb.

4. The vehicle headlamp of claim 1 wherein said first light source is an arc discharge bulb.

5. The vehicle headlamp of claim 1 wherein said second light sources provide a daylight running light.

* * * * *